(12) United States Patent
Ahn et al.

(10) Patent No.: US 6,288,343 B1
(45) Date of Patent: Sep. 11, 2001

(54) PRINTED CIRCUIT BOARD

(75) Inventors: Jung-Hyun Ahn, Seongnam; Jong-Hyun Lee, Yongin, both of (KR)

(73) Assignee: Samsung Electronics Co., Ltd., Suwon-City (KR)

( * ) Notice: Subject to any disclaimer, the term of this patent is extended or adjusted under 35 U.S.C. 154(b) by 0 days.

(21) Appl. No.: 09/414,818

(22) Filed: Oct. 8, 1999

(30) Foreign Application Priority Data

Oct. 8, 1998 (KR) .................................................. 98-42086

(51) Int. Cl.⁷ ................................. H05K 1/00; H05K 1/03
(52) U.S. Cl. .......................... 174/254; 174/255; 174/256; 174/258; 174/259; 361/749; 361/750
(58) Field of Search ........................... 174/254, 255, 174/256, 257, 258, 261, 262; 361/749, 750, 751; 29/830

(56) References Cited

U.S. PATENT DOCUMENTS

| | | | |
|---|---|---|---|
| 4,338,149 * | 7/1982 | Quaschner | 156/248 |
| 4,687,695 * | 8/1987 | Hamby | 428/192 |
| 4,800,461 * | 1/1989 | Dixon et al. | 361/751 |
| 4,931,134 * | 6/1990 | Hatkevitz et al. | 216/17 |
| 5,004,639 * | 4/1991 | Desai | 428/138 |
| 5,008,496 * | 4/1991 | Schmidt et al. | 174/254 |
| 5,072,074 * | 12/1991 | DeMaso et al. | 174/254 |
| 5,121,297 * | 6/1992 | Haas | 361/751 |
| 5,144,742 * | 9/1992 | Lucas et al. | 29/830 |
| 5,161,986 * | 11/1992 | Gulbranson et al. | 439/92 |
| 5,262,248 * | 11/1993 | Kiyota et al. | 29/846 |
| 5,263,594 * | 11/1993 | Edwin et al. | 174/254 |
| 5,499,444 * | 3/1996 | Doane, Jr. et al. | 29/830 |
| 5,576,519 * | 11/1996 | Swamy | 174/265 |
| 5,616,888 * | 4/1997 | McLaughlin et al. | 174/260 |
| 5,629,497 * | 5/1997 | Sato et al. | 174/255 |
| 5,633,480 * | 5/1997 | Sato et al. | 174/255 |
| 5,717,556 * | 2/1998 | Yanagida | 361/56 |
| 5,997,983 * | 12/1999 | Caron et al. | 428/105 |
| 6,084,778 * | 7/2000 | Mathi | 361/749 |
| 6,099,745 * | 8/2000 | McKenney et al. | 216/13 |

FOREIGN PATENT DOCUMENTS 29 46 726 * 5/1981 (DE) .
2 294 363 * 4/1996 (GB) .

\* cited by examiner

*Primary Examiner*—Jeffrey Gaffin
*Assistant Examiner*—I B Patel
(74) *Attorney, Agent, or Firm*—Howrey Simon Arnold & White, LLP

(57) ABSTRACT

Disclosed is a printed circuit board including a first layer having a first stacked region, a second stacked region spaced apart from the first stacked region by a selected distance, and a flexible connection part disposed between the first and second stacked regions, and extending to the first stacked region and the second stacked region with selected width and length, the flexible connection part having a conductive pattern layer for signal transmission between the first stacked region and the second stacked region; a pair of second layers disposed apart on an upper surface of each of the first and second stacked regions of the first layer and having a first signal pattern layer on both surfaces of each of the second layers, wherein the first signal pattern layer of the second layer is electrically connected to the conductive pattern of the flexible connection part, a pair of upper metal layers disposed on respective upper surfaces of the second layer, the upper metal layer interposing a first insulating adhesive between the upper metal layer and the second layer, a pair of third layers disposed apart on a lower surface of each of the first and second stacked regions of the first layer and having a second signal pattern layer on both surfaces of each of the third layers, and a pair of lower metal layers disposed on respective lower surfaces of the third layers, the lower metal layer interposing a second insulating adhesive between the lower metal layer and the third layer.

9 Claims, 3 Drawing Sheets

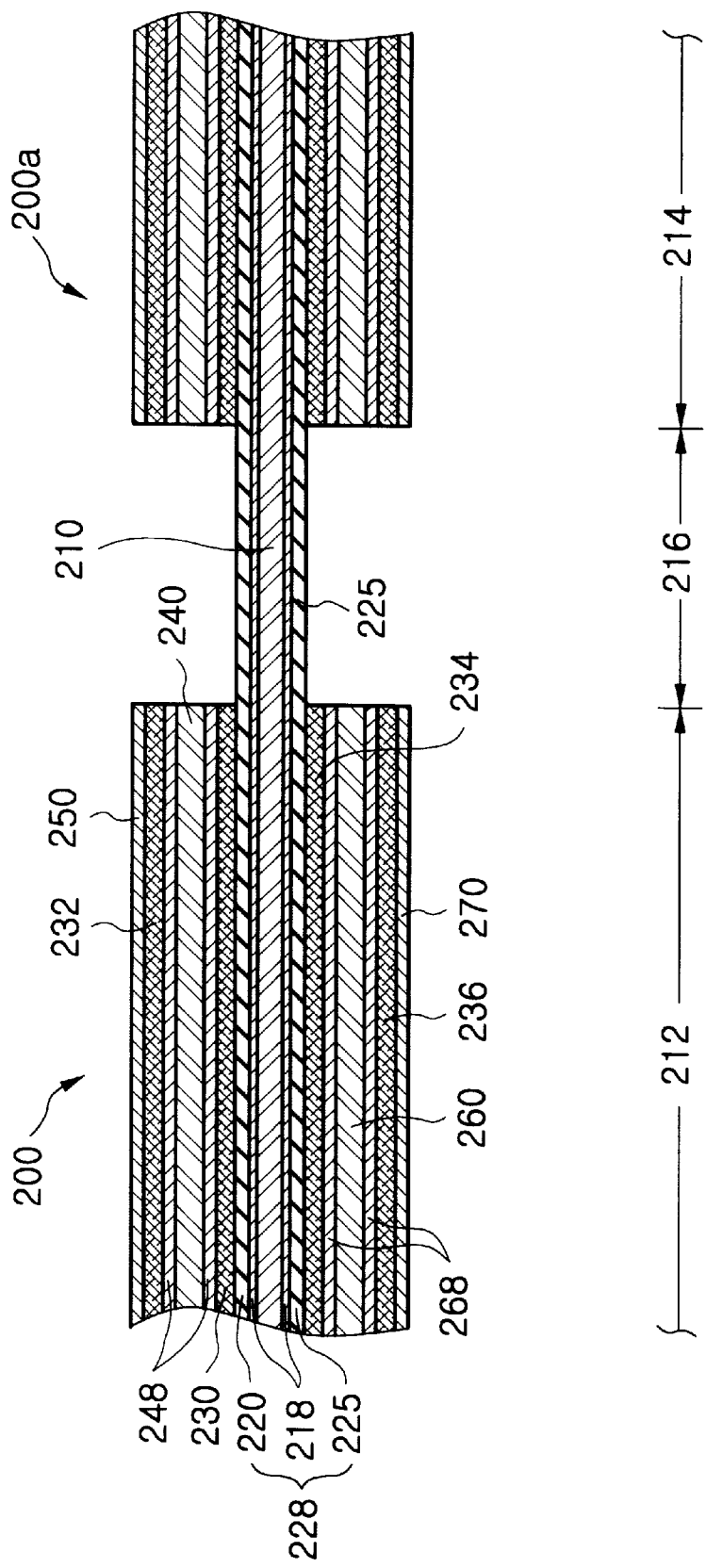

PRINTED CIRCUIT BOARD

BACKGROUND OF THE INVENTION

1. Field of the Invention

The present invention relates to a printed circuit board, and more particularly to a printed circuit board of a multi-layered structure in which each of the multi-layers has the same heat expansion coefficient and a middle layer of the multi-layers is exposed outside to form an electrical interconnection portion. In specific, the present invention relates to a printed circuit board in which a source PCB and a connector PCB have a multi-layered structure and the connector PCB that connects the source PCB with the control PCB is integrated with the source PCB.

2. Description of the Related Art

Generally, printed circuit boards (PCBs) on which electrical interconnections are printed and various devices are mounted are being used in most of electronic appliances.

Like other electronic apparatus, a liquid crystal display (LCD) also uses such PCBs for mounting the driving units displaying images on the LCD panel.

Generally, an LCD includes an LCD panel including a TFT substrate and a color filter substrate, a light source, and driving units which include a gate PCB, a source PCB, and a control PCB.

Gate PCB is used for driving gates of a plurality of thin film transistors formed on TFT substrate and source PCB is used for driving sources of the plurality of thin film transistors.

Generally, a control PCB is provided in addition to the gate PCP and the source PCB.

In LCDs that a gate PCB, a source PCB, and a control PCB are separate from each other, a connecting member such as flexible printed circuit (FPC) electrically connects the gate PCB, the source PCB and the control PCB.

When an FPC connects the source PCB and the control PCB, both terminals of the FPC are respectively connected to ports respectively mounted on the edges of the source PCB and gate PCB by a tape automated bonding (TAB) tape or by soldering. A TAB tape or soldering requires bonding, which lowers the productivity in general.

To resolve the above-described drawback, a source PCB integrated with a connector PCB is provided. The source PCB and the connector PCB respectively have a multi-layered structure.

A multi-layered structure PCB includes a flexible middle layer, a pair of rigid layers disposed on both surfaces of the flexible middle layer, and at least one conductive pattern layer disposed between the flexible middle layer and the rigid layer.

To connect the source PCB and the connector PCB, a flexible FPC is used and connected to a conductive pattern layer of each of the source PCB and the connector PCB. Here, both connectors of FPC extend not to the whole surface of the conductive pattern layer of the two PCBs but to edge portions of the PCBs facing each other, creating a step at the connection of FPC due to the thickness of the FPC. Such a step weakens the adhesive force between the conductive pattern layer and the overlying rigid layer.

Also, since the flexible middle layer of polyimide has a heat expansion coefficient different from the rigid layer of FR4 placed on both surfaces of the middle layer, the rigid layer and the flexible layer are delaminated during the soldering process of high temperature, lowering the reliability of the product.

In addition, polyimide that is more expensive than FR4 increases the total production cost of PCB.

SUMMARY OF THE INVENTION

Accordingly, it is an object of the invention to prevent delamination generation between layers of source PCB and connector PCB.

It is another object to enhance the productivity and reliability of PCB having multi-layered structure.

It is still another object to provide PCBs having a low fabrication cost.

To achieve the above objects and other advantages, the present invention provides a printed circuit board comprising a first layer having a first stacked region, a second stacked region spaced apart from the first stacked region by a selected distance, and a flexible connection part disposed between the first and second stacked regions, and extending to the first stacked region and the second stacked region with selected width and length, the flexible connection part having a conductive pattern layer for signal transmission between the first stacked region and the second stacked region and a protective layer for protecting the conductive pattern layer; a pair of second layers disposed apart on an upper surface of each of the first and second stacked regions of the first layer and having a first signal pattern layer on both surfaces of each of the second layers, wherein said first signal pattern layer of the second layer is electrically connected to the conductive pattern of the flexible connection part; a pair of upper metal layers disposed on respective upper surfaces of the second layer, the upper metal layer interposing a first insulating adhesive between the upper metal layer and the second layer; a pair of third layers disposed apart on a lower surface of each of the first and second stacked regions of the first layer and having a second signal pattern layer on both surfaces of each of the third layers; and a pair of lower metal layers disposed on respective lower surfaces of the third layers, the lower metal layer interposing a second insulating adhesive between the lower metal layer and the third layer.

It is desirable that the first, second, and third layers are made of the same FR4 containing glass epoxy resin.

BRIEF DESCRIPTION OF THE DRAWINGS

The above objects and other advantages of the present invention will become more apparent by describing in detail a preferred embodiment thererof with reference to the attached drawings in which:

FIG. 3 is a sectional view taken along the line 3—3 of FIG. 2.

DETAILED DESCRIPTION OF THE PREFERRED EMBODIMENTS

A printed circuit board for LCDs according to the present invention is now described more fully hereinafter with reference to the accompanying drawings.

Figure 1:
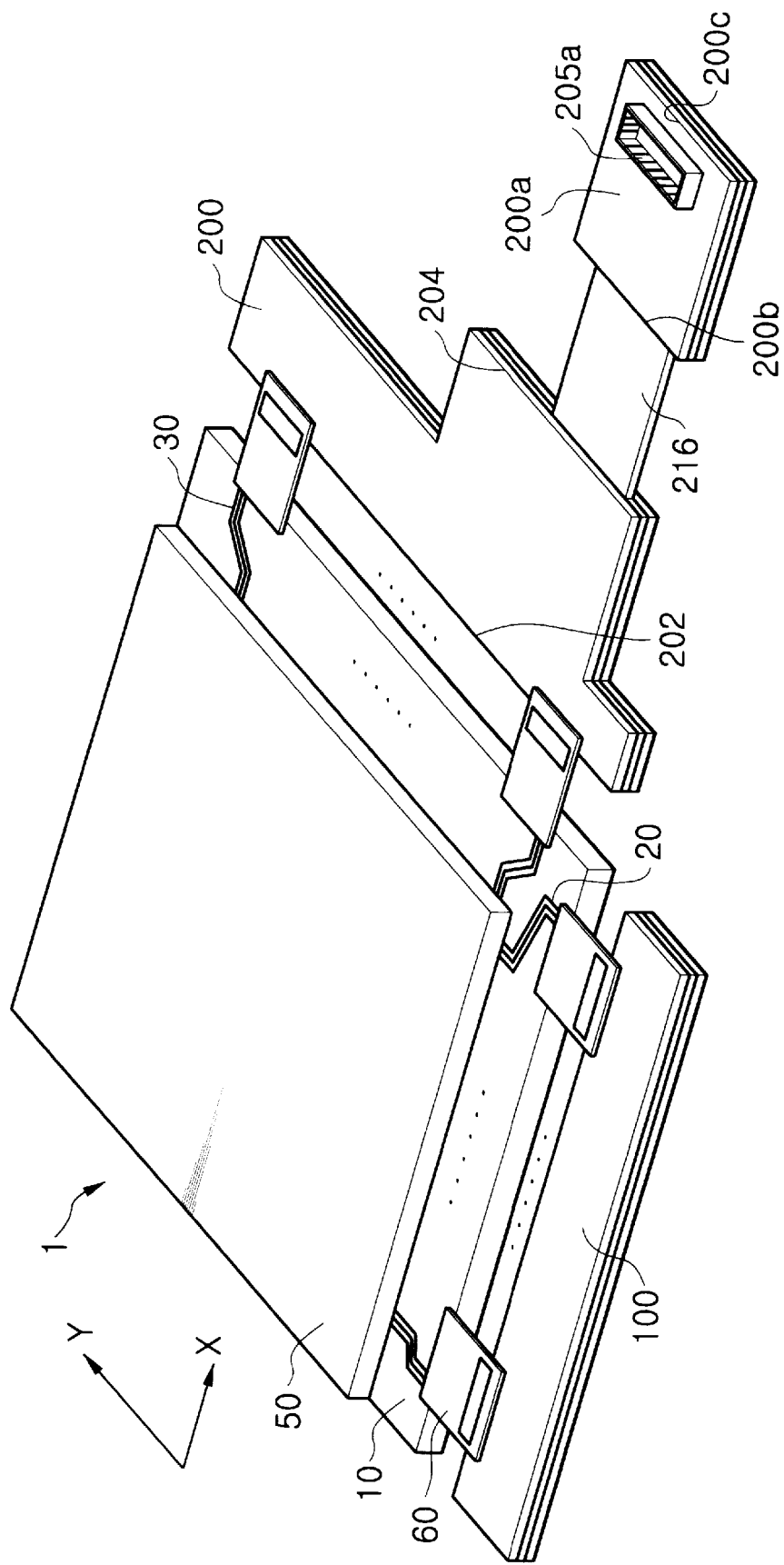
FIG. 1 is a simplified perspective view of an LCD according to an embodiment of the present invention.

Referring to FIG. 1, an LCD panel 1 includes a TFT substrate 10, a color filter substrate 50 facing the TFT substrate 10, and a liquid crystal layer interposed between the TFT substrate 10 and the color filter substrate 50. The TFT substrate 10 is bigger than the color filter substrate 50.

Although not shown in FIG. 1, the TFT substrate includes a plurality of TFTs with the matrix arrangement, each consisting of three terminals of gate, source, and drain; data lines arranged in parallel with X-direction and connected to source terminals of the TFTs; and gate lines arranged in parallel with Y-direction and connected to gate terminals.

Referring to the FIG. 1, the gate lines 20 and data lines 30 extend to the both side edges of the TFT substrate 10 and are exposed to the outside for the connection with the drive PCBs 100, 200.

At the extended ends of the gate lines 20 and data lines 30, there are provided input pads (not shown) for external drive signals.

Gate PCB 100 is disposed spaced apart from one-sided edge of the TFT substrate 10 and along the X-direction and data PCB 200 is disposed spaced apart from the other side edge of the TFT substrate 10 and along the Y-direction.

Gate PCB 100 is electrically connected to the gate lines 20 through multiple tape carrier packages 60 and source PCB 200 is electrically connected to the data lines 30 through multiple tape carrier packages 60.

Figure 2:
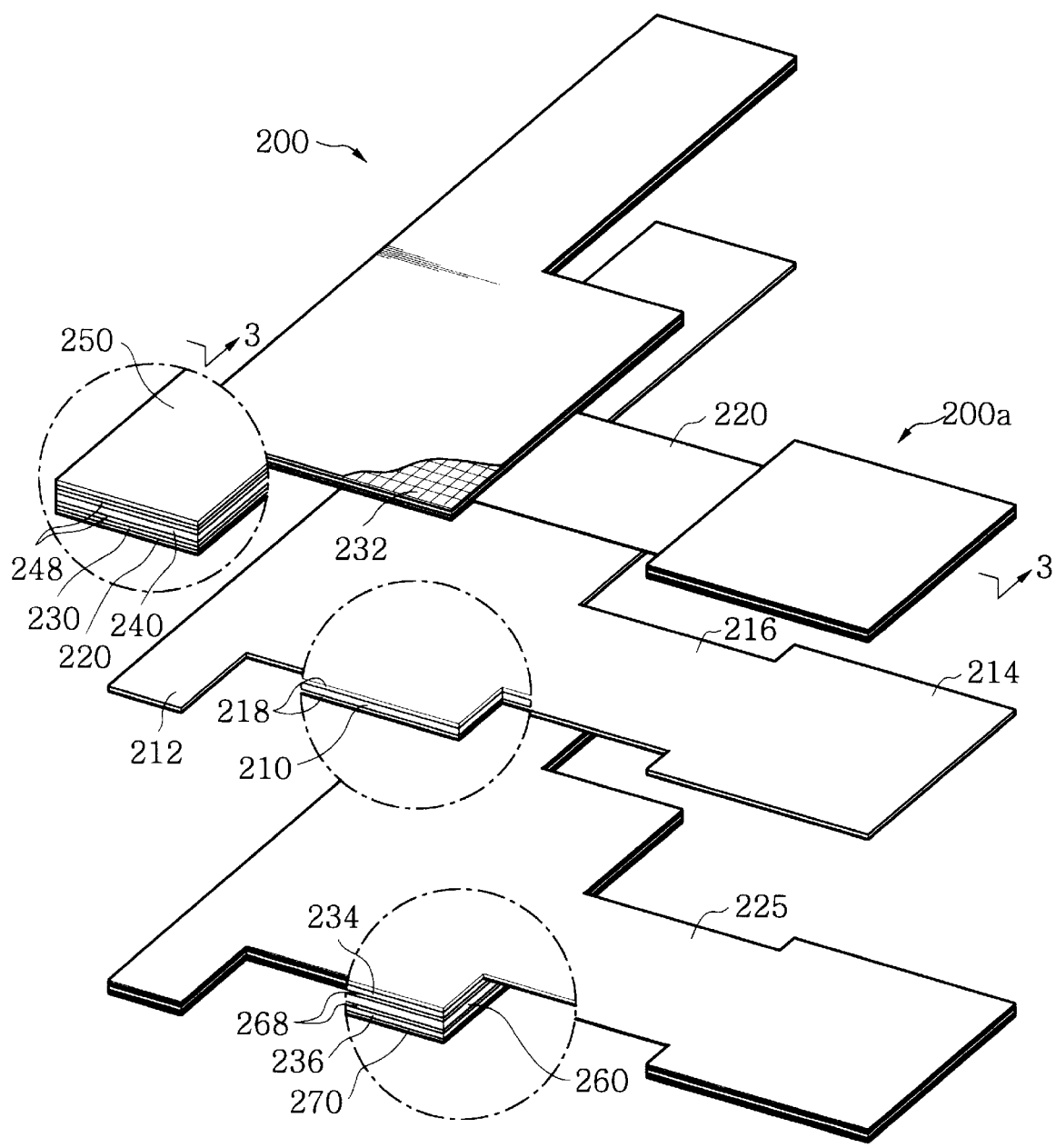
FIG. 2 is an exploded perspective view of FIG. 1.

Referring to FIG. 2 and FIG. 3, source PCB 200 is integrated with connector PCB 200a through a connection member 228. In other words, one end of the connection member 228 extends to an end line 202 of the source PCB 200 and the other end of the connection part 216 extends to an end line 200c of the connector PCB 200a. The respective extending portions of the connection member 228 form the middle layer (hereinafter referred to as "first layer") of the source PCB 200 and the connector PCB 200a.

The connection member 228 includes the first layer 210 of FR4, a pair of conductive pattern layers 218 disposed respectively on both surfaces of the first layer 210, and protective layers 220 and 225 made of polyimide disposed on both surfaces of the conductive pattern layers 218. The protective layers 220 and 225 protect the first layer 210 from external environment and enhance durability.

Multiple layers are deposited on surfaces of the protective layers 220 and 225 except a connecting part 216 placed between source PCB region 212 and connector PCB region 214. Hereinafter, the source PCB region 212 is referred to as "first stacked region" and the connector PCB region 214 is referred to as "second stacked region" for he convenience of the description.

At the first stacked region 212, a resin penetration processed layer 230-(hereinafter referred to as "first resin penetration processed layer") is formed on the protective layer 220. On top of that, a second layer 240 having the same heat expansion coefficient as the first layer 210 is laid. On both surfaces of the second layer 240, conductive pattern layers 248 are disposed. Another resin penetration processed layer (hereinafter referred to as "second resin penetration processed layer") 232 is disposed on the upper pattern layer 248. A thin metal layer (250) is disposed on the second resin penetration processed layer 232.

Meanwhile, below the protective layer 225 of the first stacked region 212, there are also stacked multiple layers of a first resin penetration processed layer 234, pattern layers 268, a third layer 260, a second resin penetration processed layer 236, and a metal thin film 270, in a symmetric manner with the multiple layers 230, 248, 232, 250 over the connecting member 228. Here, the third layer 260 has the same heat coefficient as the first layer 210.

Like the first stacked region 212, the second stacked region 214 has the same symmetrical multi-layered structure.

Here, the conductive pattern layers 218, 248, 268 are electrically connected to each other through via holes (not shown) formed between the layers. Especially, the conductive pattern layers 218 is formed on the whole surface of the first layer 210 to electrically connect the source PCB 200 with the connector PCB 200a.

The first to third layers 210, 240 and 260 are made of somewhat flexible material so that they are easily folded while the connector 205a is connected to the gate PCB 100. For instance, they are made of a material containing glass epoxy resin component and are classified as FR4 according to National Electrical Manufacturers Association ("NEMA") standard. FR4 is comparatively cheap in price compared with polyimide.

To enhance the flexibility of the connecting member 228, the first layer 210 can be made thinner than the second layer 240 and the third layer 260. The use of the resin containing material having the same heat expansion coefficient for the first to third layers 210, 240, 260 prevents delaminating the first to third layers 210, 240, and 260.

The conductive pattern layers 218 has a height difference from the first layer of base film due to the metal interconnection printed on the first layer. Therefore, the protective layers 220 and 225 not only protect the pattern layers 218 but eliminate the space between the first layer 210 and the second layer 240 and between the first layer 210 and the third layer 260.

Unlike the conventional art, since the connecting member 228 including the conductive pattern layer 218 and the protective layer 220, 225 are formed on the whole region of the first and second stacked regions 212, 214, delamination can be prevented.

The resin penetration processed layers 230, 232, 234, 236 are made of epoxy adhesive coated on a non woven fabric consisting of warp thread and weft thread as shown in FIG. 2. It has the protective layers 220, 225, the metal layers 250, 270 on both surfaces thereof and simultaneously insulate the conductive pattern layers 218, 248, 268 formed on each layer of the first to third layers 210, 240, 260 from the upper metal layer 250 and lower metal layer 270.

Returning to FIG. 1, a connector 205a is disposed on the surface of the connector PCB 200a and is connected to a port of a control PCB(not shown) for controlling the source PCB 200 and the gate PCB 100 in a board to board connecting method.

Meanwhile, although the present embodiment shows and describes that the conductive pattern layer for the source PCB and connector PCB is four layers, the PCB is not restricted to four layered structure and can be also applied to at least one layer PCB.

As described previously, the present invention enhances the productivity and the reliability by applying a multi-layer structured PCB each layer of which has the same heat expansion coefficient.

In addition, since the middle layers simultaneously used in the source PCB and the connector PCB electrically connect the source PCB with the gate PCB without an additional, separate connector fabrication process is simplified.

Moreover, since a material having good resin penetration capability is interposed between the pattern layers, the layers are not delaminated due to the spaces between the layers.

Although the present invention has been particularly shown and described with reference to a particular embodiment, for example, the source PCB and the connector PCB of LCD, the present invention is not limited to the field. Various changes and modifications may be effected by one having an ordinary skill in the art and remain within the scope of the invention, as defined by the appended claims.

What is claimed is:

1. A printed circuit board, comprising:
a first layer with a top surface area, said first layer having a first stacked region, a second stacked region apart from the first stacked region, and a flexible connection part disposed between the first and second stacked regions and extending to the first stacked region and the second stacked regions and extending to the first stacked region and the second stacked region with selected width and length, wherein the entire top surface area of the first layer has a protective layer for preventing delamination and for protecting a conductive pattern layer laid for a signal transmission between the first stacked region and the second stacked region;
a pair of second layers disposed apart on an upper surface of each of the first stacked region and the second stacked region of the first layer and having a first signal pattern layer on both surfaces of each of the second layers, wherein said first signal pattern layer of the second layer is electrically connected to the conductive pattern of the flexible connection part;
a pair of upper metal layers disposed on respective upper surfaces of the second layer, the upper metal layer interposing a first insulating adhesive between the upper metal layer and the second layer;
a pair of third layers disposed apart on a lower surface of each of the first and second stacked regions of the first layer and having a second signal pattern layer on both surfaces of each of the third layers; and
a pair of lower metal layers disposed on respective lower surfaces of the third layers, the lower metal layer interposing a second insulating adhesive between the lower metal layer and the third layer.

2. The printed circuit board of claim 1, wherein the first, second and third layers are made of the same material.

3. The printed circuit board of claim 2, wherein the first, second and third layers comprise glass epoxy resin.

4. The printed circuit board of claim 3, wherein the first, second and third layers are FR4.

5. The printed circuit board of claim 1, wherein the first layer is thinner than the second or third layer.

6. The printed circuit board of claim 1, wherein the second layer has the same heat expansion coefficient with the first layer.

7. The printed circuit board of claim 1, wherein the third layer has the same heat expansion coefficient with the first layer.

8. A printed circuit board, comprising:
a first layer with a top surface area, said first layer having a first stacked region, a second staked region spaced apart from the first stacked region, and a flexible connection part disposed between the firs and the second stacked regions, and extending to the first stacked region and the second stacked region with selected width and length, wherein the entire top surface area of the first layer has a protective layer for preventing delamination and for protecting a conductive pattern layer laid for signal transmission between the first stacked region and the second stacked region;
a pair of protective layers disposed on both surfaces of each of the first layers, for protecting the flexible connection part from external environment;
a pair of second layers disposed apart on an upper surface of each of the first stacked region and the second stacked region of the first layer, comprising a first signal pattern layer on both surfaces of each of the second layers, and having the same heat expansion coefficient with the first layer, wherein said first signal pattern layer of the second layer is electrically connected to the conductive pattern of the flexible connection part;
a pair of upper metal layers disposed on respective upper surfaces of the second layer, the upper metal layer interposing a first insulating adhesive between the upper metal layer and the second layer;
a pair of third layers disposed apart on a lower surface of each of the first and second stacked regions of the first layer, comprising a second signal pattern layer on both surfaces of each of the third layers, and having the same heat expansion coefficient with the first layer; and
a pair of lower metal layers disposed on respective lower surfaces of the third layers, the lower metal layer interposing a second insulating adhesive between the lower metal layer and the third layer.

9. The printed circuit board of claim 8, wherein the first, second, and third layers are made of FR4 containing glass epoxy resin.

* * * * *